(12) United States Patent
Kajita et al.

(10) Patent No.: US 7,034,398 B2
(45) Date of Patent: Apr. 25, 2006

(54) SEMICONDUCTOR DEVICE HAVING CONTACT PLUG AND BURIED CONDUCTIVE FILM THEREIN

(75) Inventors: Akihiro Kajita, Yokohama (JP); Kazuyuki Higashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/706,043

(22) Filed: Nov. 13, 2003

(65) Prior Publication Data

US 2005/0023701 A1 Feb. 3, 2005

(30) Foreign Application Priority Data

Jul. 30, 2003 (JP) .............................. 2003-203662

(51) Int. Cl.
*H01L 27/10* (2006.01)
*H01L 23/48* (2006.01)

(52) U.S. Cl. ...................... 257/758; 257/774; 257/773; 257/301; 257/505; 257/748; 257/304; 257/303; 257/762; 257/764; 257/767; 257/766

(58) Field of Classification Search ................ 257/758, 257/774, 773, 301, 303, 304, 505, 748, 762, 257/764, 767, 766
See application file for complete search history.

(56) References Cited

U.S. PATENT DOCUMENTS

| 5,744,394 | A | * | 4/1998 | Iguchi et al. | ................. | 438/276 |
|---|---|---|---|---|---|---|
| 5,854,104 | A | * | 12/1998 | Onishi et al. | ................. | 438/240 |
| 5,933,758 | A | * | 8/1999 | Jain | ............................. | 438/687 |
| 6,008,124 | A | * | 12/1999 | Sekiguchi et al. | .......... | 438/653 |
| 6,046,100 | A | * | 4/2000 | Ramaswami et al. | ........ | 438/624 |
| 6,048,792 | A | * | 4/2000 | Watanabe et al. | ............ | 438/656 |
| 6,066,528 | A | * | 5/2000 | Fazan et al. | .................. | 438/253 |
| 6,090,701 | A | * | 7/2000 | Hasunuma et al. | .......... | 438/632 |
| 6,140,675 | A | * | 10/2000 | Sugiura et al. | .............. | 257/301 |
| 6,144,099 | A | * | 11/2000 | Lopatin et al. | .............. | 257/758 |
| 6,153,460 | A | * | 11/2000 | Ohnishi et al. | .............. | 438/238 |
| 6,177,338 | B1 | * | 1/2001 | Liaw et al. | ................... | 438/629 |
| 6,246,085 | B1 | * | 6/2001 | Yoshida | ....................... | 257/301 |
| 6,271,084 | B1 | * | 8/2001 | Tu et al. | ...................... | 438/253 |
| 6,423,626 | B1 | * | 7/2002 | Srinivasan et al. | ........... | 438/618 |
| 6,551,920 | B1 | * | 4/2003 | Uchiyama et al. | ........... | 438/624 |
| 6,576,512 | B1 | * | 6/2003 | Taniguchi et al. | ........... | 438/257 |
| 6,602,782 | B1 | * | 8/2003 | Lee et al. | .................... | 438/674 |
| 6,680,538 | B1 | * | 1/2004 | Kim et al. | ................... | 257/751 |
| 6,683,000 | B1 | * | 1/2004 | Fukui et al. | ................. | 438/672 |
| 6,686,251 | B1 | * | 2/2004 | Igarashi | ....................... | 438/364 |

(Continued)

FOREIGN PATENT DOCUMENTS

JP 2001-298083 10/2001

*Primary Examiner*—Alexander Oscar Williams
(74) *Attorney, Agent, or Firm*—Oblon, Spivak, McClelland, Maier & Neustadt, P.C.

(57) ABSTRACT

A semiconductor device includes an active element structure that is formed on a semiconductor substrate and has a connection region formed in the surface of the semiconductor substrate. A contact hole extends from a surface of a first insulating film formed on the semiconductor substrate to the connection region. A contact plug is provided in the contact hole. A clearance formed in the contact plug is formed with a buried conductive film consisting of a material different from the contact plug. The buried conductive film has a continuous surface without forming a step with the surface of the contact plug.

6 Claims, 5 Drawing Sheets

U.S. PATENT DOCUMENTS

| | | |
|---|---|---|
| 6,734,559 B1 * | 5/2004 | Yang et al. .................. 257/751 |
| 6,737,356 B1 * | 5/2004 | Dow ........................... 438/696 |
| 6,764,950 B1 * | 7/2004 | Noguchi et al. ............ 438/687 |
| 2002/0030274 A1 * | 3/2002 | Chopra ....................... 257/751 |
| 2003/0143839 A1 * | 7/2003 | Raaijmakers et al. ....... 438/633 |
| 2004/0214436 A1 * | 10/2004 | Dow ........................... 438/689 |
| 2005/0023686 A1 * | 2/2005 | Lin ............................. 257/751 |
| 2005/0074966 A1 * | 4/2005 | Rhodes ....................... 438/629 |
| 2005/0161765 A1 * | 7/2005 | Tsau ........................... 257/528 |

\* cited by examiner

SEMICONDUCTOR DEVICE HAVING CONTACT PLUG AND BURIED CONDUCTIVE FILM THEREIN

CROSS-REFERENCE TO RELATED APPLICATIONS

This application is based upon and claims the benefit of priority from the prior Japanese Patent Application No. 2003-203662, filed Jul. 30, 2003, the entire contents of which are incorporated herein by reference.

BACKGROUND OF THE INVENTION

1. Field of the Invention

The present invention relates to a semiconductor device, more particularly, to interconnects and contact structure of the semiconductor device.

2. Description of the Related Art

In order to prevent RC delay of a transfer signal of semiconductor devices, copper (Cu) is used as the interconnect material. In this case, an anti-diffusion metal film (barrier metal) is located between interconnect layer and an insulating film in order to prevent the copper from being diffused to the insulating film such as interlayer insulating film.

The following method of manufacturing the semiconductor device is given. A contact hole for connecting the lowermost interconnect layer and a transistor on a semiconductor substrate is formed in an interlayer insulating film. The contact hole is filled with tungsten via a contact (adhesive) layer. Extra tungsten on the interlayer insulating film is removed by CMP (Chemical Mechanical Polishing), and thereby, a contact plug is formed. An interconnect trench is formed in an interlayer insulating film further formed on the interlayer insulating film, and the interconnect trench is filled with copper via the barrier metal. By doing so, an interconnect layer is formed.

In the process of filling the contact hole with tungsten, an empty space calling a seam (void) 52 is formed as shown in FIG. 13 and FIG. 14. The cause of the case shown in FIG. 13 is because a contact hole 51 is formed into a shape of a barrel. For this reason, the opening of the contact hole 51 is closed before the contact hole 51 is filled with tungsten.

The cause of the case shown in FIG. 14 is because a contact layer 53 is thicker than other portions at the upper portion of the contact hole 51. This results from the characteristic of sputtering or CVD (Chemical Vapor Deposition) process employed in forming the contact layer 53. In this case also, the opening of the contact hole 51 is closed before the contact hole 51 is filled with tungsten, as in FIG. 13.

As seen from FIG. 13 and FIG. 14, the seam 52 is formed in the contact hole 51; as a result, the following problem arises. More specifically, the seam 52 is again opened or the diameter increases in the process of removing extra tungsten using CMP and in the RIE (reactive Ion Etching) process for forming an interconnect trench 57. As a result, a barrier metal 55 intrudes into the seam 52 when being formed, as illustrated in FIG. 15. For this reason, the barrier metal 55 is formed with a broken portion 56 in the interconnect trench 57.

If an interconnect material film (copper) is formed in the interconnect trench 57 in a state that the broken portion 56 is formed, there is the following problem. Electro-migration resistance is reduced in the interconnect layer with the broken portion 56 as the base point; as a result, high reliability is not obtained. If the film thickness of the barrier metal 55 is smaller than the opening diameter or depth of the seam 52, the problem described above remarkably appears.

Even if no seam 52 is formed, the surface of tungsten is rough; for this reason, the contact hole 51 is not fully filled. As a result, a clearance is formed. In the RIE process for forming the interconnect trench 57, the initially formed clearance further widens; for this reason, the same state as the seam is formed.

BRIEF SUMMARY OF THE INVENTION

According to a first aspect of the present invention, there is provided a semiconductor device comprising: a semiconductor substrate; an active element structure formed on the semiconductor substrate, and having a connection region formed in the surface of the semiconductor substrate; a first insulating film provided on the semiconductor substrate; a contact hole extending from a surface of the first insulating film to the connection region; a contact plug provided in the contact hole; and a buried conductive film filled in a clearance formed in the contact plug, consisting of a material different from the contact plug, and having a continuous surface without forming a step with the surface of the contact plug.

According to a second aspect of the present invention, there is provided a semiconductor device comprising: a semiconductor substrate; an active element structure formed on the semiconductor substrate, and having a connection region formed in the surface of the semiconductor substrate; a first insulating film provided on the semiconductor substrate; a contact hole extending from a surface of the first insulating film to the connection region; a first intervention conductive film provided on the inner surface of the contact plug; a second intervention conductive film provided on the first intervention conductive film, having a film thickness of 10 nm or less, and consisting of a material different from the first intervention conductive film; and a contact plug consisting substantially of Cu filled in the contact hole.

According to a third aspect of the present invention, there is provided a method of manufacturing a semiconductor device comprising: forming an active element structure having a connection region on a semiconductor substrate, the connection region formed in a surface of the semiconductor substrate; forming a first insulating film on the semiconductor substrate, the insulating film having a contact hole extending from a surface of the first insulating film to the connection region; filling the contact hole with a first conductive material film; and filling a clearance which is formed in the contact hole in the process of filling the first conductive material film with a second conductive material film to have a continuous surface without forming a step with the surface of the first conductive material film, the second conductive material film different from the first conductive material film.

According to a fourth aspect of the present invention, there is provided a method of manufacturing a semiconductor device comprising: forming an active element structure having a connection region on the semiconductor substrate, the connection region formed in a surface of the semiconductor substrate; forming a first insulating film on the semiconductor substrate, the first insulating film having an interconnect hole extending from a surface of the first insulating film to the connection region; forming a first intervention conductive film on the inner surface of the interconnect hole; forming a second intervention conductive film on the first intervention conductive film, the second intervention conductive film having a film thickness of 10 nm or less and consisting of a material different from the first intervention conductive film; and filling the interconnect hole with a film consisting substantially of Cu.

DETAILED DESCRIPTION OF THE INVENTION

Figure 1:
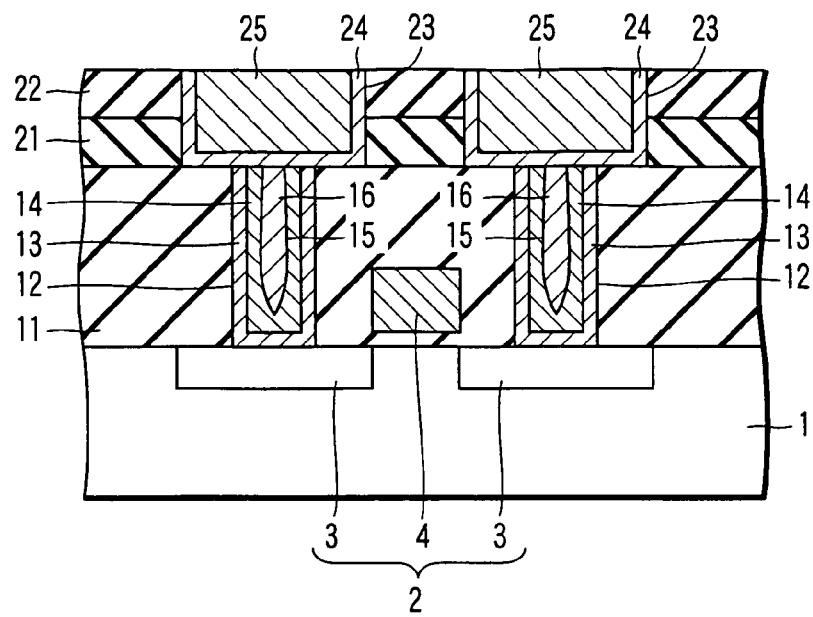
FIG. 1 is a cross-sectional view schematically showing a semiconductor device according to a first embodiment of the present invention.

Embodiments of the present invention will be described below with reference to the accompanying drawings. In the following description, the same reference numerals are used to designate elements having the same function and configuration, and an overlapping explanation will be made if necessary.

(First Embodiment)

Figure 15:
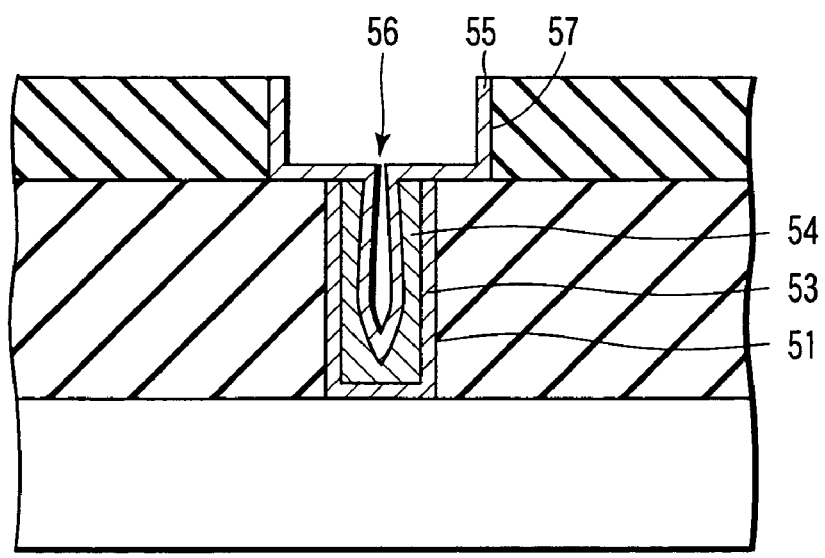

In the development process of the present invention, the inventors have conducted research on a semiconductor device which can prevent the barrier metal 55 from being broken on the seam 52, as shown in FIG. 15. As a result, the inventors have obtained the following.

The barrier metal 55 intrudes into the seam 52 because the film thickness is small. Thus, the film thickness of the barrier metal 55 is formed larger than the opening of the seam 52. By doing so, the barrier metal 55 is prevented from intruding into the seam 52; therefore, the barrier metal 55 is not formed with broken portion 56.

However, the following problem arises if the barrier metal 55 is formed thicker. More specifically, if the barrier metal 55 is formed thicker, the ratio occupied by the barrier metal 55 in the interconnect trench 57 becomes high. The material used as the barrier metal 55 usually has a specific resistance ten times that of copper. As a result, the resistance value of the interconnect layer increases; therefore, semiconductor device performance is reduced. With micro-fabrication of semiconductor devices, when the sectional area of the interconnect trench 57 becomes small, the ratio occupied by the barrier metal 55 in the interconnect trench 57 becomes high. As a result, the foregoing problem remarkably appears. The following is a description on the first embodiment of the present invention based on the above.

FIG. 1 is a cross-sectional view schematically showing a semiconductor device according to a first embodiment of the present invention. As shown in FIG. 1, a transistor (active element structure) 2 is formed on a semiconductor substrate 1. The transistor 2 has source/drain diffusion layers (connection region) 3 and a gate electrode 4 on a gate insulating film (not shown). In FIG. 1, a transistor is given as the active element structure formed on the semiconductor substrate. However, the present invention is not limited to a transistor, and any other element structures may be used so long as they obtain a predetermined operation, action and effect, and have electrical connection region.

The entire surface of the semiconductor substrate 1 is formed with an interlayer insulating film (first insulating film) 11. A contact hole 12 is formed to extend from the upper surface of the interlayer insulating film 11 to the gate electrode 4 and the source/drain diffusion layers 3. A contact layer (barrier metal) 13 (first intervention conductive film) consisting of a third conductive material is provided on the inner surface of the contact hole 12 and the interlayer insulating film 11. For example, the third conductive film consists of Ti (titanium), TiN (titanium nitride), TiSiN (titanium silicide nitride and a stacked film containing a combination thereof.

The contact hole 12 is filled with the first conductive material via the contact layer 13, and thereby, a contact plug 14 is formed. The first conductive material consists substantially of W (tungsten).

The contact plug 14 is formed with a seam (clearance) 15. A buried conductive film 16 is buried in the seam 15. The buried conductive film 16 consists substantially of a second conductive-material different from the first conductive material. Materials buried more preferable than the first conductive material are selected as the second conductive material. More specifically, TiN, TiSiN, Ta (tantalum), TaN (tantalum nitride) and a stacked film containing a combination thereof may be used. Other reasons why these conductive materials (second conductive material) are used will be described later. The buried conductive film 16 has a continuous surface without forming a step with the surface of the contact plug 14.

An interlayer insulating film 21 (second insulating film) is provided on the interlayer insulating film 11. For example, an organic film having a permittivity of 2.7 or less is used as the interlayer insulating film 21. A protection film 22 is provided on the interlayer insulating film 21. The protection film 22 protects the interlayer insulating film 21, and for example, consists of a silicon oxide film.

The protection film 22 and the interlayer insulating film 21 are formed with an interconnect trench 23. The interconnect trench 23 is formed so that the bottom surface thereof extends to the contact plug 14 penetrating through the interlayer insulating film 21 from the upper surface of the protection film 22.

A barrier metal 24 is provided on the inner surface of the interconnect trench 23. The barrier metal 24 consists of Ta, Tan and TiSiN, for example. The bottom surface of the barrier metal 24 is common to the surface of the contact plug 14 and the buried conductive film 16. The interconnect trench 23 is filled with Cu via the barrier metal 24, and thereby, an interconnect layer 25 is formed.

Figure 2:
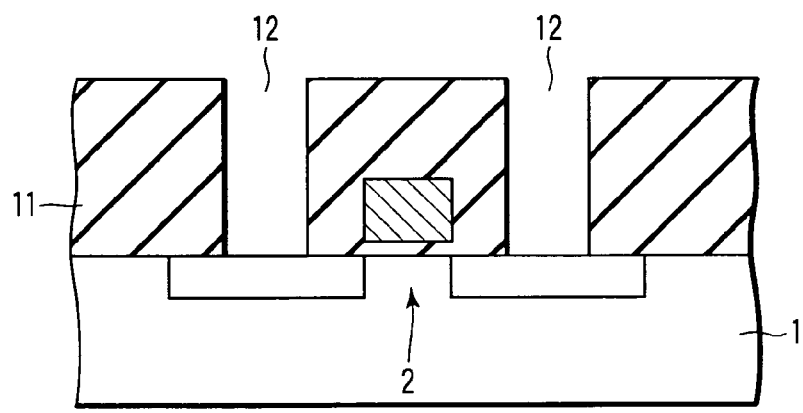
FIGS. 2, 3, 4, 5, 6, and 7 are cross-sectional views sequentially showing the process of manufacturing the semiconductor device of FIG. 1.

The process of manufacturing the semiconductor device shown in FIG. 1 will be described with reference to FIG. 1 to FIG. 7. FIG. 2 to FIG. 7 are cross-sectional views sequentially showing the process of manufacturing the semiconductor device of FIG. 1. As shown in FIG. 2, the surface of the semiconductor substrate 1 is formed with the transistor 2, and thereafter, the interlayer insulating film 11 is formed on the semiconductor substrate 1. The interlayer insulating film 11 is formed with the contact hole 12 using etching techniques such as photolithography and RIE.

Figure 3:
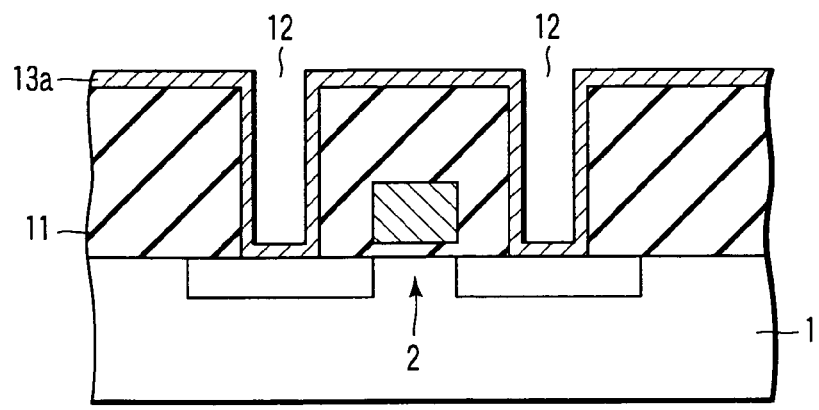

As illustrated in FIG. 3, a material film (film 13a consisting of a third conductive material) of the contact layer 13 is deposited on the entire surface of the semiconductor substrate 1 using sputtering, CVD or both of these processes.

Figure 4:
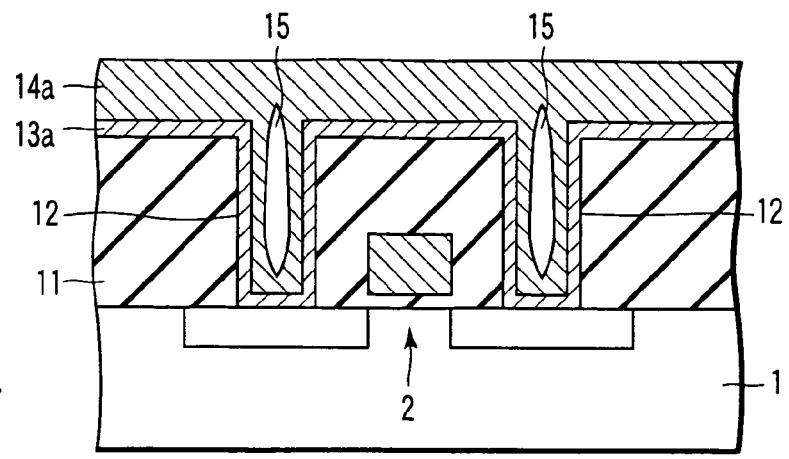

As depicted in FIG. 4, a material film (film consisting of first conductive material) 14a of the contact plug 14 is deposited on the entire surface of the semiconductor substrate 1 using CVD. As a result, the contact hole 12 is filled with the first conductive material film 14a. In this case, the contact hole 12 is formed with the seam 15.

Figure 5:
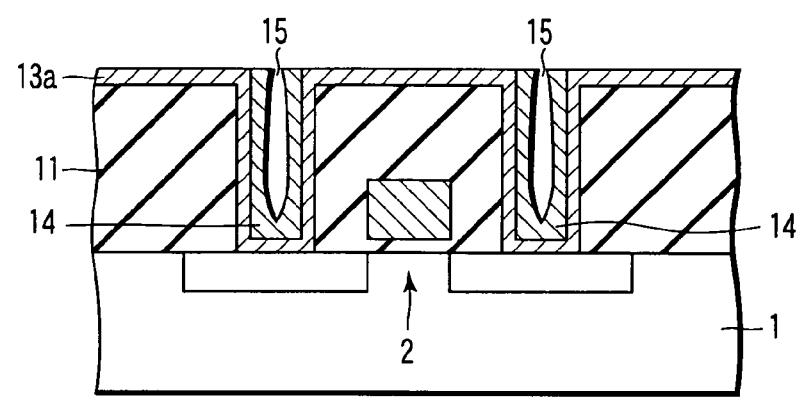

As seen from FIG. 5, the first conductive material film 14a on the third conductive material film 13a on the interlayer insulating film 11 is removed by CMP. As a result, the contact plug 14 is formed. In this case, the third conductive material film 13a functions as an etching stopper. In the above-mentioned process, the third conductive material film 13a on the contact hole 12 is partially removed, and thereby, the seam is opened.

Figure 6:
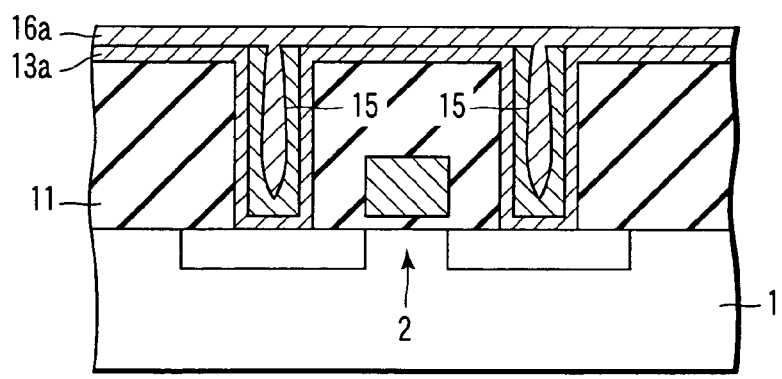

As shown in FIG. 6, a material film (film 16a consisting of second conductive material) of the buried conductive film 16 is deposited on the entire surface of the semiconductor substrate 1. In this case, typical sputtering, that is, physical deposition is employed. Preferably, CVD may be employed. This is based on the following reason. According to the CVD process, the second conductive material film 16a is deposited without forming a significant step in each portion. In the foregoing process, the seam 15 is formed with the buried conductive film 16. The previously formed opening of the seam 16 is closed with the buried conductive film 16.

Figure 7:
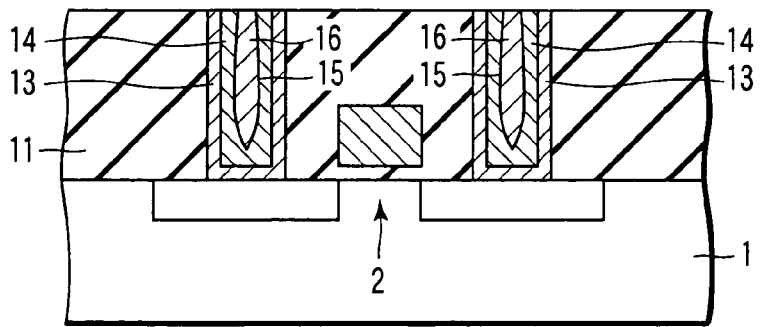

As illustrated in FIG. 7, the third conductive material film 13a and the second conductive material film 16a on the interlayer insulating film 11 is removed by CMP. As a result, the contact plug 14 and the buried conductive film 16 are formed.

The third conductive material film 13a consists of Ti, TiN, TiSiN and a stacked film containing them, as described before. The second conductive material film 16a consists of TiN, TiSiN Ta, Tan and a stacked film containing them, as described before. These materials are removed using CMP under the same condition. In other words, the same material is selected so that third conductive material film 13a and the second conductive material film 16a can be removed under the same condition. Thus, in the CMP process shown in FIG. 7, third conductive material film and the second conductive material film 16a on the interlayer insulating film 11 are simultaneously removed.

As seen from FIG. 1, the interlayer insulating film 21 and the protection film 22 are formed on the entire surface of the semiconductor substrate 1 according to a known process. The interlayer insulating film 21 and the protection film 22 are formed with the interconnect trench 23 according to a known process. The interconnect layer 25 is formed in the interconnect trench 23 via the barrier metal 24 according to a known process. In this case, the opening of the seam 15 is closed with the buried conductive film 16, and no step is formed on the surface of the contact plug 14 and the buried conductive film 16. Therefore, the barrier metal 24 is not broken on the seam 15. Thereafter, interlayer insulating film, contact plug and interconnect layer (these are not shown) are further formed if desired.

According to the first embodiment of the present invention, the semiconductor device has the following structure. The buried conductive film 16 is provided in the seam 15 formed in the contact plug 14 reaching the semiconductor substrate 1. Thus, the opening of the seam 15 is closed with the buried conductive film 16, and no step is formed on the surface of the contact plug 14 and the buried conductive film 16. In addition, the barrier metal 24 is provided on the surface of the foregoing films. By doing so, the barrier metal 24 is prevented from intruding into the seam 15, so that the barrier metal 24 can be prevented from being broken in the interconnect trench 23. The barrier metal 24 is prevented from being broken, and thereby, this serves to prevent the reduction of electro-migration resistance. In other words, it is possible to realize a semiconductor device having high reliability.

According to the first embodiment, the materials of the buried conductive film 16 and the contact layer 13, that is, second and third conductive materials are selected so that they can be removed in the CMP process under the same condition. Therefore, these material films on the semiconductor substrate are simultaneously removed in the same process, so that the number of processes can be reduced.

According to the first embodiment, it is possible to solve the problem that the barrier metal 24 is broken on the upper portion of the seam 15 without employing the method of forming the barrier metal 24 thicker. Therefore, the volume of the barrier metal 24 to the interconnect layer 25 can be reduced like the conventional case. In other words, this serves to reduce the resistance value of the interconnect layer 25, so that high-reliability semiconductor device can be realized.

In view of an increase of the resistance value of the interconnect layer 25, if the film thickness of the barrier metal 24 is equal to or less than 10% of the cross section of the interconnect trench 23, the barrier metal easily intrudes into the seam 15. Therefore, the first embodiment is particularly effective in the case described above.

(Second Embodiment)

The inventors have obtained the following knowledge to realize a semiconductor device that can solve the problem described in FIG. 15, in the development process of the present invention. The knowledge will be explained below.

There has been known the method of using copper as the material of the interconnect layer, and forming the copper by plating. According to the method, Cu is preferably formed. In addition, Cu has specific resistance smaller than tungsten (W). Thus, the proposal to use Cu as the contact plug material is made.

However, the following problem arises if the contact plug contacting with the semiconductor substrate is formed of Cu. More specifically, Cu is provided in the contact hole via the barrier metal in such a case. The barrier metal is very thin, and resulting from the property of Cu, Cu diffuses to the semiconductor substrate via the barrier metal in heat treatment. The following is a description on the second embodiment of the present invention based on the knowledge described above.

Figure 8:
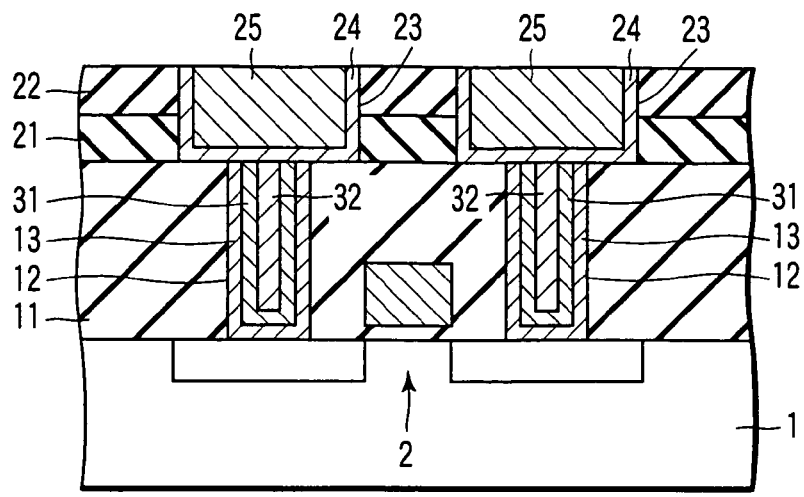
FIG. 8 is a cross-sectional view schematically showing a semiconductor device according to a second embodiment of the present invention.

FIG. 8 is a cross-sectional view schematically showing a semiconductor device according to a second embodiment of the present invention. As shown in FIG. 8, a conductive film 31 (second intervention conductive film) is provided on the inner surface of the contact hole 12 via the barrier metal 13. The conductive film 31 will be described later.

The contact hole 12 is filled with a fourth conductive material via barrier metal 13 and conductive film 31, and thereby, a contact plug 32 is formed. A material having low resistance and capable of being preferably buried is used as the fourth conductive material; typically, Cu is used. The remaining structure is the same as the first embodiment.

The conductive film 31 will be explained below. The following material is selected as a fifth conductive material for forming the conductive film 31. The material has the property of preventing the fourth conductive material molecules (atom) forming the contact plug 32 from diffusing to the semiconductor substrate 1 via the barrier metal 13. More specifically, W, WN (tungsten nitride), WSiN (tungsten silicide nitride) and a stacked film containing a combination thereof may be used.

The thicker the conductive film 31 is, the higher the function of preventing the diffusion of metal molecules from the contact plug 32 becomes. However, if the conductive film 31 is too thick, the opening of the contact hole 12 is closed before the contact hole 12 is filled, like the conventional case. Considering the conditions described above, the thickness of the conductive film 31 is set to 1 to 10 nm, preferably, 2 to 5 nm. The thickness of the conductive film 31 may be set to 1 to 10% of the diameter of the contact hole 12, preferably, 2 to 5%.

Figure 9:
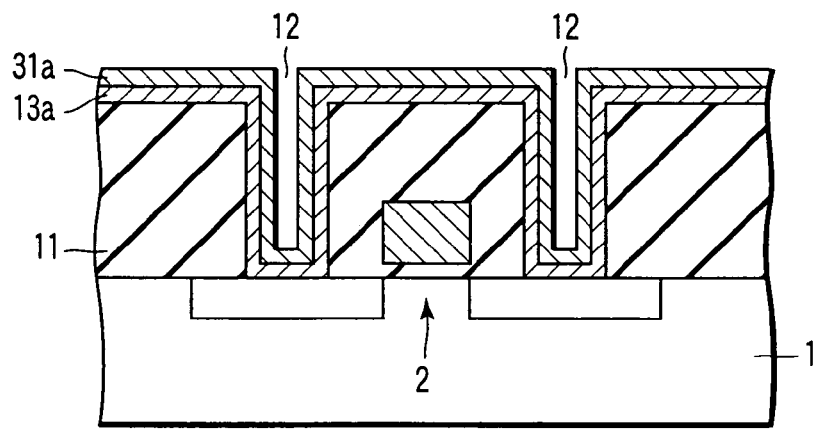
FIG. 9 is a cross-sectional view schematically showing the process of manufacturing the semiconductor device of FIG. 8.
Figure 10:
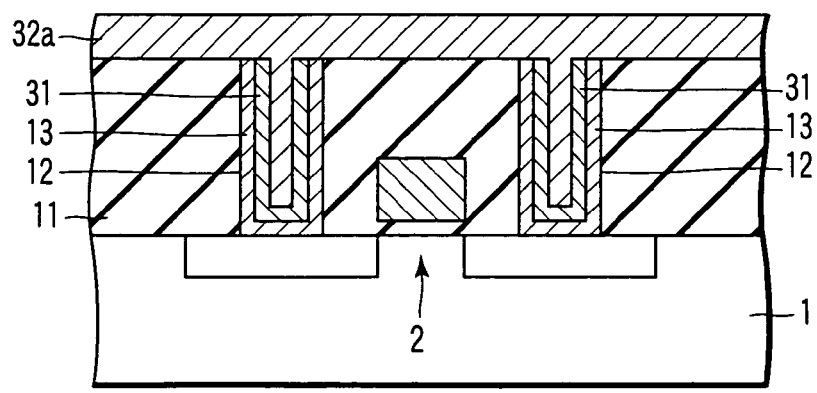
FIG. 10 is a cross-sectional view schematically showing the process following FIG. 9.

The process of manufacturing the semiconductor device of FIG. 8 will be described below. FIG. 9 is a cross-sectional view schematically showing part of the process of manufacturing the semiconductor device of FIG. 8, and shows the process following FIG. 3. FIG. 10 shows the process following FIG. 9. As shown in FIG. 9, a fifth conductive material film 31a is formed on the third conductive material film 13a (barrier metal material film) by sputtering or CVD. ALD (Atomic Layer Deposition) process is employed, and thereby, it is possible to highly accurately control the film thickness of the fifth conductive material film 31a. Thereafter, the fifth conductive material film 31a and the third conductive material film 13a on the interlayer insulating film 11 are removed by CMP, and thereby, the conductive film 31 and the barrier metal 13 are formed.

As illustrated in FIG. 10, a material film 32a consisting of the fourth conductive material is deposited on the entire surface of the semiconductor substrate 1 by plating. The contact plug 32 formed by plating is preferably buried in the contact hole 12, unlike the case where it is formed by CVD using tungsten. Therefore, no seam is formed therein.

The fourth conductive material film 32a on the interlayer insulating film 11 is removed, and thereby, the contact plug 32 is formed. Thereafter, interlayer insulating film 21, barrier metal 24 and interconnect layer 25 are formed in the same manner as the first embodiment. Thereafter, interlayer insulating film, contact plug and interconnect layer (these are not shown) are further formed, if desired.

According to the second embodiment of the present invention, the contact plug 32 is formed of the conductive material capable of being preferably buried in the semiconductor device. Thus, no seam is formed in the contact plug 32 unlike the case of forming the contact plug out of tungsten. Consequently, the same effect as the first embodiment is obtained. A substance having low resistance is used as the conductive material forming the contact plug 32, so that the resistance of the contact plug 32 can be reduced.

According to the second embodiment of the present invention, the contact plug 32 is formed in the contact hole 12 via the barrier metal 13 and the conductive film 31. Thus, it is possible to prevent the molecules of the contact plug 32 from diffusing to the semiconductor substrate 1 in a heat treatment process.

(Third Embodiment)

The third embodiment relates to an example in which the second embodiment is applied to a semiconductor device having a so-called dual damascene structure.

Figure 11:
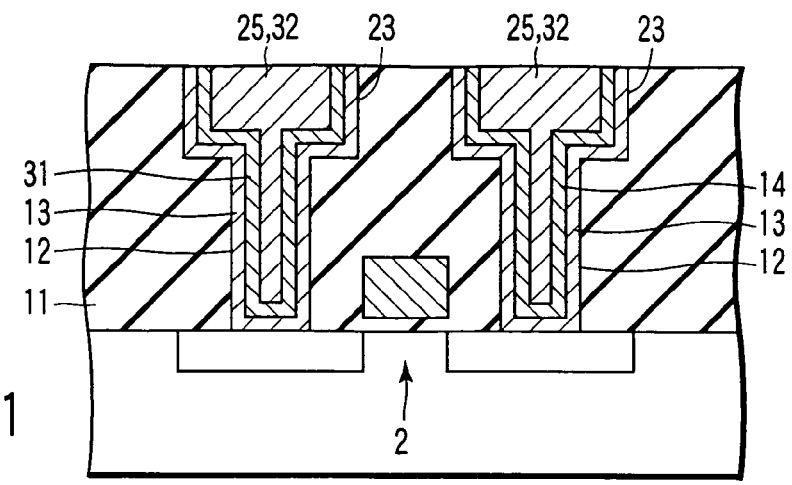
FIG. 11 is a cross-sectional view schematically showing a semiconductor device according to a third embodiment of the present invention.

FIG. 11 is a cross-sectional view schematically showing a semiconductor device according to a third embodiment of the present invention. As shown in FIG. 11, the barrier metal 13 is provided over the range from the inner surface of the contact hole 12 to that of the interconnect trench 23. The conductive film 31 extends onto the barrier metal 13. Namely, the conductive film 31 is formed over the inner surface from the contact hole 12 to the interconnect trench 23. The contact hole 12 and the interconnect trench 23 are filled with the fourth conductive material film via the barrier metal 13 and the conductive film 31, and thereby, the interconnect layer 25 and the contact plug 32 are formed.

The film thickness of the conductive film 31 is determined in the same manner as the second embodiment so that no seam is formed in the contact hole 12. However, according to the third embodiment, another factor is taken into consideration. Namely, the conductive film 31 having resistance higher than the interconnect layer 25 is formed in the interconnect trench 23. For this reason, there is a need for preventing an increase of the volume of the conductive film 31 to the interconnect layer 25. Considering the above-mentioned factor, the thickness of the conductive film 31 is set to 1 to 7 nm, preferably 2 to 5 nm in the third embodiment.

Figure 12:
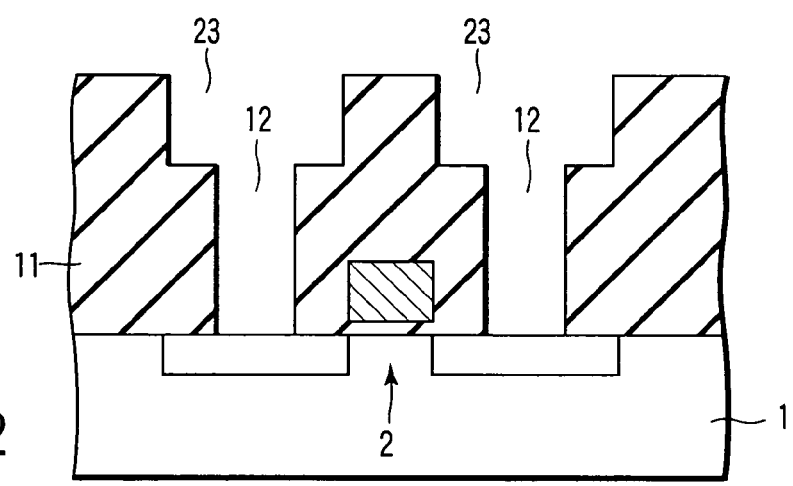
FIG. 12 is a cross-sectional view schematically showing the process of manufacturing the semiconductor device of FIG. 11.
Figure 13:
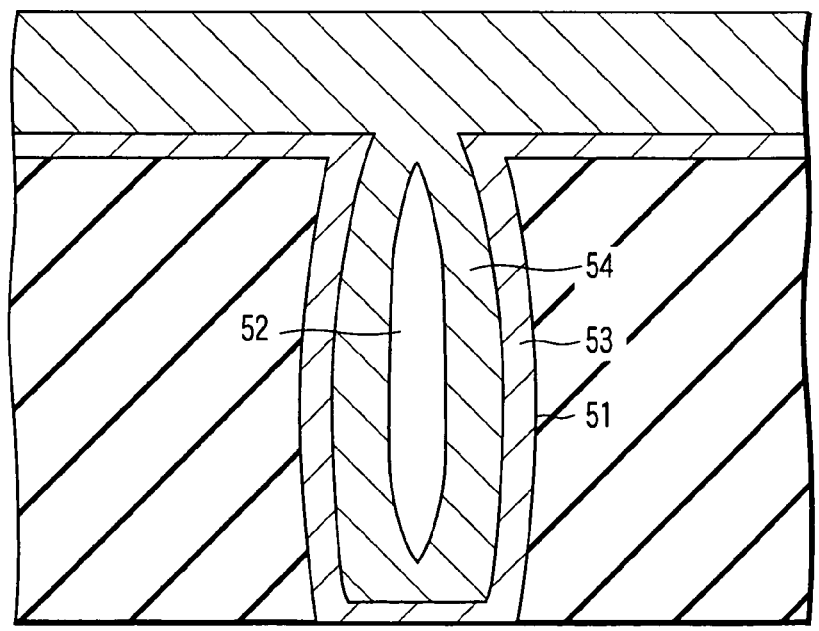
FIGS. 13, 14, and 15 are cross-sectional views showing the vicinity of contact plug of a conventional semiconductor device.
Figure 14:
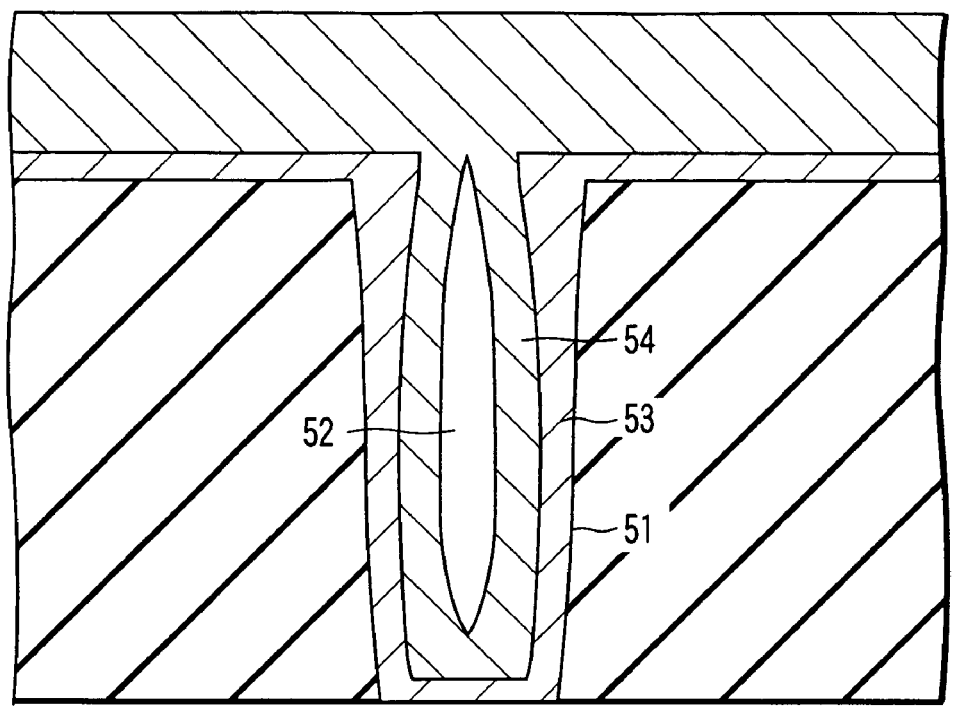

The process of manufacturing the semiconductor device of FIG. 11 will be described below. FIG. 12 is a cross-sectional view schematically showing the process of manufacturing the semiconductor device of FIG. 11. As shown in FIG. 12, the transistor 2 is formed on the surface of the semiconductor substrate 1, and thereafter, the interlayer insulating film 11 is formed thereon. The interlayer insulating film 11 is formed with interconnect trench 23 and contact hole 12 connected to the source/drain diffusion layers 3 using etching techniques such as photolithography and RIE.

As seen from FIG. 11, the third conductive material film 13a (material film of barrier metal 13) is deposited on the surface of contact hole 12 and interconnect trench 23 using sputtering, CVD or both of these processes. The fifth conductive material film 31a (material film of conductive film 31) is deposited on the third conductive material film 13a using sputtering, CVD or both of these processes. Of course, ALD process may be employed in order to form the fifth conductive material film 31a, like the second embodiment. The contact hole 12 and the interconnect trench 23 are filled with the fourth conductive material film 32a by plating. The fourth conductive material film 32a on the interlayer insulating film 11 is removed by CMP, and thereby, the contact plug 32 and the interconnect layer 25 are formed. Thereafter, interlayer insulating film, contact plug and interconnect layer (these are not shown) are further formed, if desired.

According to the third embodiment of the present invention, the same effect as the second embodiment is obtained in the semiconductor device. In addition, according to the third embodiment, the contact plug 32 and the interconnect layer 25 have dual damascene structure. Therefore, it is possible to realize a semiconductor device, which can simultaneously obtain the following effects. The effects are to reduce the number of manufacturing process, have low-resistance interconnect layer 25 and contact plug 14, and prevent a seam from being formed in the contact plug 14.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   an active element structure formed on the semiconductor substrate, and having a connection region formed in the surface of the semiconductor substrate;
   a first insulating film provided on the semiconductor substrate;
   a contact hole extending from a surface of the first insulating film to the connection region;
   a contact plug provided in the contact hole;
   a buried conductive film filled in a clearance formed in the contact plug, consisting of a material different from the contact plug, having a continuous surface without forming a step with the surface of the contact plug, and having a first width in the surface of the buried conductive film and a second width larger than the first width in a deeper position than the surface of the buried conductive film; and
   a first intervention conductive film interposed between an inner surface of the contact hole and the contact plug, the first intervention conductive film and the buried conductive film consisting substantially of the same material.

2. The device according to claim 1, further comprising:
   a barrier metal provided in an interconnect trench formed on the contact plug and the buried conductive film, and having a bottom surface common to the upper surface of the contact plug and the buried conductive film; and
   an interconnect layer provided in the interconnect trench, and consisting of a conductive material.

3. The device according to claim 1, wherein the buried conductive film and the first intervention conductive film consist substantially of a material selected from the group consisting of TiN and TiSiN.

4. The device according to claim 2, wherein a film thickness of the first intervention conductive film is equal to or less than 10% of the width of cross section of the interconnect trench.

5. The device according to claim 1, wherein the active element structure includes a transistor.

6. The device according to claim 1, wherein the contact plug consists substantially of W.

* * * * *